US011245245B2

(12) United States Patent
Enya et al.

(10) Patent No.: US 11,245,245 B2
(45) Date of Patent: Feb. 8, 2022

(54) OPTICAL MODULE

(71) Applicant: SUMITOMO ELECTRIC INDUSTRIES, LTD., Osaka (JP)

(72) Inventors: Yohei Enya, Osaka (JP); Shinya Ito, Osaka (JP); Hiromi Nakanishi, Osaka (JP); Takashi Kyono, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 169 days.

(21) Appl. No.: 16/613,568

(22) PCT Filed: Mar. 5, 2019

(86) PCT No.: PCT/JP2019/008542
§ 371 (c)(1),
(2) Date: Nov. 14, 2019

(87) PCT Pub. No.: WO2019/211943
PCT Pub. Date: Nov. 7, 2019

(65) Prior Publication Data
US 2021/0167573 A1      Jun. 3, 2021

(30) Foreign Application Priority Data

May 2, 2018    (JP) .............................. JP2018-088876

(51) Int. Cl.
*H01S 5/02255*    (2021.01)
*H01S 5/02253*    (2021.01)
(Continued)

(52) U.S. Cl.
CPC ...... *H01S 5/02255* (2021.01); *G02B 26/0858* (2013.01); *G02B 26/10* (2013.01);
(Continued)

(58) Field of Classification Search
CPC .............. H01S 5/02438; H01S 5/0239; H01S 5/02208; H01S 5/02255; G02B 26/08; H01L 21/2652
(Continued)

(56) References Cited

U.S. PATENT DOCUMENTS 6,154,259 A * 11/2000 Hargis ................. H04N 5/7416
348/756
9,941,667 B2 * 4/2018 Nakanishi ............ H01S 5/0683
(Continued)

FOREIGN PATENT DOCUMENTS

JP    2014-056199 A    3/2014
JP    2014-186068 A    10/2014
(Continued)

*Primary Examiner* — Tuan N Nguyen
(74) *Attorney, Agent, or Firm* — Oliff PLC

(57) ABSTRACT

An optical module includes a light-forming unit configured to form light, and a protective member surrounding and sealing the light-forming unit. The light-forming unit includes a base member including an electronic temperature control module, a plurality of laser diodes arranged on the base member, a filter arranged on the base member and configured to multiplex light from the plurality of laser diodes, a beam shaping portion arranged on the base member and configured to convert a beam shape of the light multiplexed by the filter, and a MEMS arranged on the base member and including a scanning mirror configured to scan the light shaped in the beam shaping portion. The protective member includes a base body, and a lid welded to the base body.

5 Claims, 14 Drawing Sheets

(51) Int. Cl.
*G02B 26/08* (2006.01)
*G02B 26/10* (2006.01)
*H01S 5/40* (2006.01)

(52) U.S. Cl.
CPC ........ *H01S 5/02253* (2021.01); *H01S 5/4012* (2013.01); *H01S 5/4031* (2013.01); *H01S 5/4093* (2013.01)

(58) Field of Classification Search
USPC ...................................................... 372/44.01
See application file for complete search history.

(56) References Cited

U.S. PATENT DOCUMENTS

| | | | | |
|---|---|---|---|---|
| 2014/0078473 | A1* | 3/2014 | Kusaka | G02B 27/0972 353/33 |
| 2014/0240952 | A1* | 8/2014 | Nakanishi | H01S 5/02253 362/19 |
| 2015/0338664 | A1* | 11/2015 | Nakanishi | H01S 5/4012 362/231 |
| 2017/0193156 | A1* | 7/2017 | Nervi | G06F 30/20 |
| 2017/0207606 | A1* | 7/2017 | Nakanishi | H01S 5/32316 |
| 2017/0293156 | A1 | 10/2017 | Saracco et al. | |
| 2018/0191136 | A1* | 7/2018 | Nakanishi | H01S 5/4093 |

FOREIGN PATENT DOCUMENTS

| | | |
|---|---|---|
| JP | 2015-138114 A | 7/2015 |
| JP | 2016-015415 A | 1/2016 |
| WO | 2007/120831 A2 | 10/2007 |

* cited by examiner

OPTICAL MODULE

TECHNICAL FIELD

The present disclosure relates to an optical module.

This application claims priority based on Japanese Patent Application No. 2018-088876 filed on May 2, 2018, and the entire contents of this Japanese Patent Application are incorporated herein by reference.

BACKGROUND ART

Optical modules including a light-emitting unit that multiplexes light from a plurality of semiconductor light-emitting elements and a scanning unit that scans the light from the light-emitting unit are known (see, for example, Japanese Patent Application Laid-Open No. 2014-186068 (Patent Literature 1), Japanese Patent Application Laid-Open No. 2014-56199 (Patent Literature 2), and International Patent Publication No. WO 2007/120831 (Patent Literature 3)).

CITATION LIST

Patent Literature

Patent Literature 1: Japanese Patent Application Laid-Open No. 2014-186068
Patent Literature 2: Japanese Patent Application Laid-Open No. 2014-56199
Patent Literature 3: International Patent Publication No. WO 2007/120831

SUMMARY OF INVENTION

An optical module according to the present disclosure includes a light-forming unit configured to form light, and a protective member surrounding and sealing the light-forming unit. The light-forming unit includes a base member including an electronic temperature control module, a plurality of laser diodes arranged on the base member, a filter arranged on the base member and configured to multiplex light from the plurality of laser diodes, a beam shaping portion arranged on the base member and configured to convert a beam shape of the light multiplexed by the filter, and a micro electro mechanical systems (MEMS) arranged on the base member and including a scanning mirror configured to scan the light shaped in the beam shaping portion. The protective member includes a base body, and a lid welded to the base body.

DESCRIPTION OF EMBODIMENTS

Figure 1:
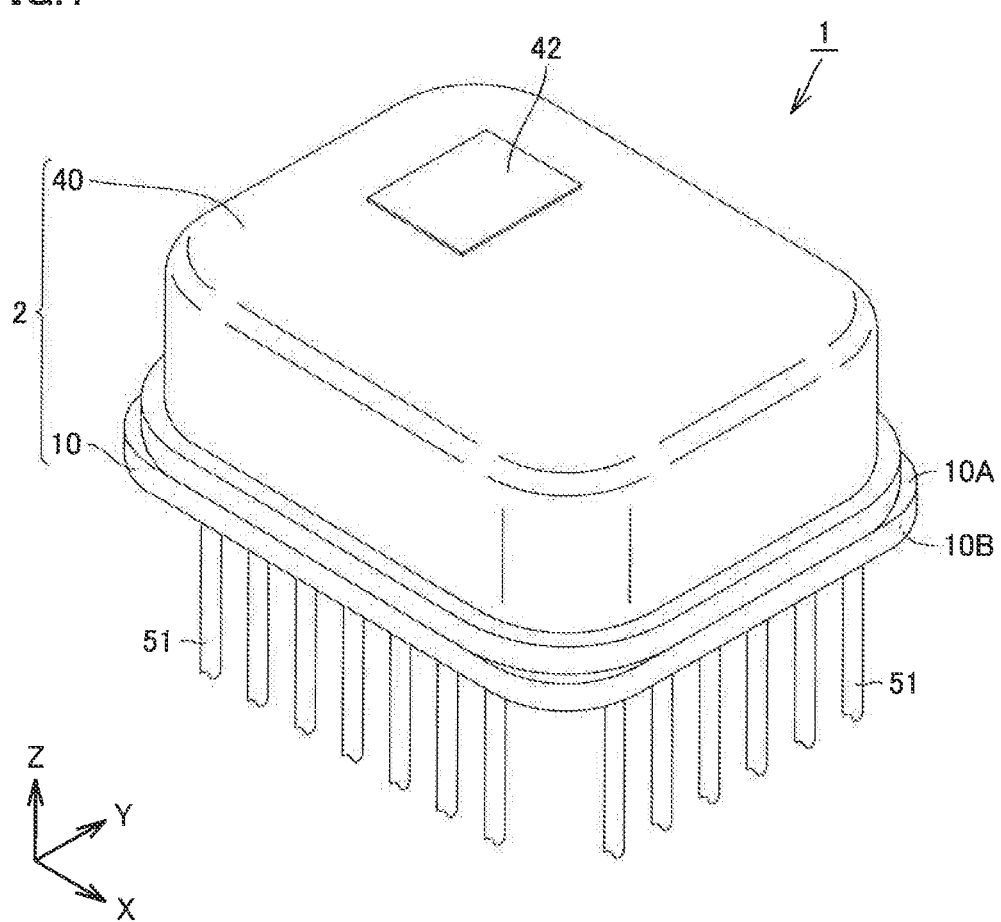
FIG. 1 is a schematic perspective view showing the structure of an optical module in Embodiment 1.

Problems to be Solved by the Present Disclosure

In the optical modules, reliability is essential. The optical modules may be used at various environmental temperatures. The optical modules therefore require operational stability against temperature changes.

An object is thus to provide an optical module excellent in reliability and in operational stability against temperature changes.

Advantageous Effects of the Present Disclosure

The optical module according to the present disclosure provides an optical module that is excellent in reliability and in operational stability against temperature changes.

Description of Embodiments of the Present Disclosure

Embodiments of the present disclosure will be listed and described first. An optical module according to the present disclosure includes a light-forming unit configured to form light, and a protective member surrounding and sealing the light-forming unit. The light-forming unit includes a base member including an electronic temperature control module, a plurality of laser diodes arranged on the base member, a filter arranged on the base member and configured to multiplex light from the plurality of laser diodes, a beam shaping portion arranged on the base member and configured to convert a beam shape of the light multiplexed by the filter, and a MEMS arranged on the base member and including a scanning mirror configured to scan the light shaped in the beam shaping portion. The protective member includes a base body, and a lid welded to the base body.

The optical module of the present disclosure includes the protective member, which includes the base body and the lid welded to the base body, and seals the light-forming unit. In other words, the light-forming unit is hermetically sealed by the protective member. With this, the laser diodes, the MEMS, and others included in the light-forming unit are effectively protected from the external environment, thereby ensuring high reliability. The MEMS of the optical module of the present disclosure is disposed on the base member including the electronic temperature control module. Generally, in the MEMS including a scanning mirror, the scanning mirror has its optical deflection angle varied depending on the temperature. In the optical module of the present disclosure, the electronic temperature control module included in the base member is capable of controlling the temperature of the MEMS to fall within an appropriate range. The optical module of the present disclosure thus has improved stability in operation against temperature changes. As described above, the optical module according to the present disclosure provides an optical module that is excellent in reliability as well as in operational stability against temperature changes.

In the optical module described above, the MEMS may be a piezoelectric MEMS.

A piezoelectric MEMS including a scanning mirror is advantageous in that they are compact in size and ensure a large optical deflection angle. However, the piezoelectric MEMS including the scanning mirror is disadvantageous in that the optical deflection angle of the scanning mirror considerably varies depending on the temperature. In the optical module of the present disclosure, such a disadvantage can be compensated for as the electronic temperature control module included in the base member controls the temperature of the MEMS. The piezoelectric MEMS is therefore suitable as the MEMS included in the optical module of the present disclosure.

In the optical module described above, the beam shaping portion may be an aperture member.

Examples of the beam shaping portion for converting the shape, in cross section perpendicular to the traveling direction, of the light incident on the scanning mirror in the MEMS include a lens, a prism, and the like. However, the use of such components leads to an increased production cost of the optical module. Adopting the aperture member as the beam shaping portion can reduce the production cost of the optical module.

In the optical module described above, the plurality of laser diodes may be controlled by auto current control (ACC).

A laser diode can be controlled by auto power control (APC), for example. In the APC, the value of the current passed through the laser diode is controlled on the basis of the intensity of light emitted from the laser diode. This enables more reliable control of the intensity of light even when the relationship between the current flowing through the laser diode and the intensity of the light emitted from the laser diode changes due to a temperature change. However, in order to perform the APC, it is necessary to receive light from the laser diode by a light-receiving element, and feedback the intensity of the obtained light for the control of the value of the current to be passed through the laser diode. The use of such a light-receiving element leads to an increased production cost of the optical module. On the other hand, in the ACC, the value of the current passed through the laser diode is determined on the basis of desired intensity of light, and control is performed such that the value of the current is kept constant as long as the desired intensity of light remains unchanged. This eliminates the need of a light-receiving element that receives light from the laser diode, leading to a reduced production cost of the optical module. However, there is a disadvantage that, when the relationship between the current flowing through the laser diode and the intensity of the light emitted from the laser diode changes due to a temperature change, it becomes difficult to appropriately control the intensity of the light. In the optical module of the present disclosure, such a disadvantage can be compensated for as the electronic temperature control module included in the base member controls the temperatures of the laser diodes.

Further, part of the light from a laser diode does not have to be applied to the light-receiving element, so the loss of the light is reduced. Therefore, for example even when the aperture member is adopted as the beam shaping portion, sufficient intensity of light is readily secured for the light to be output from the optical module. Accordingly, adopting the ACC can reduce the production cost of the optical module of the present disclosure, and also reduce the loss of the light.

In the optical module described above, the plurality of laser diodes may include a laser diode that emits red light, a laser diode that emits green light, and a laser diode that emits blue light. This enables multiplexing of these light beams to form light of a desired color.

Details of Embodiments of the Present Disclosure

Embodiments of the optical module according to the present disclosure will be described below with reference to the drawings. In the drawings below, the same or corresponding elements are denoted by the same reference numerals, and the description thereof will not be repeated.

Embodiment 1

Figure 2:
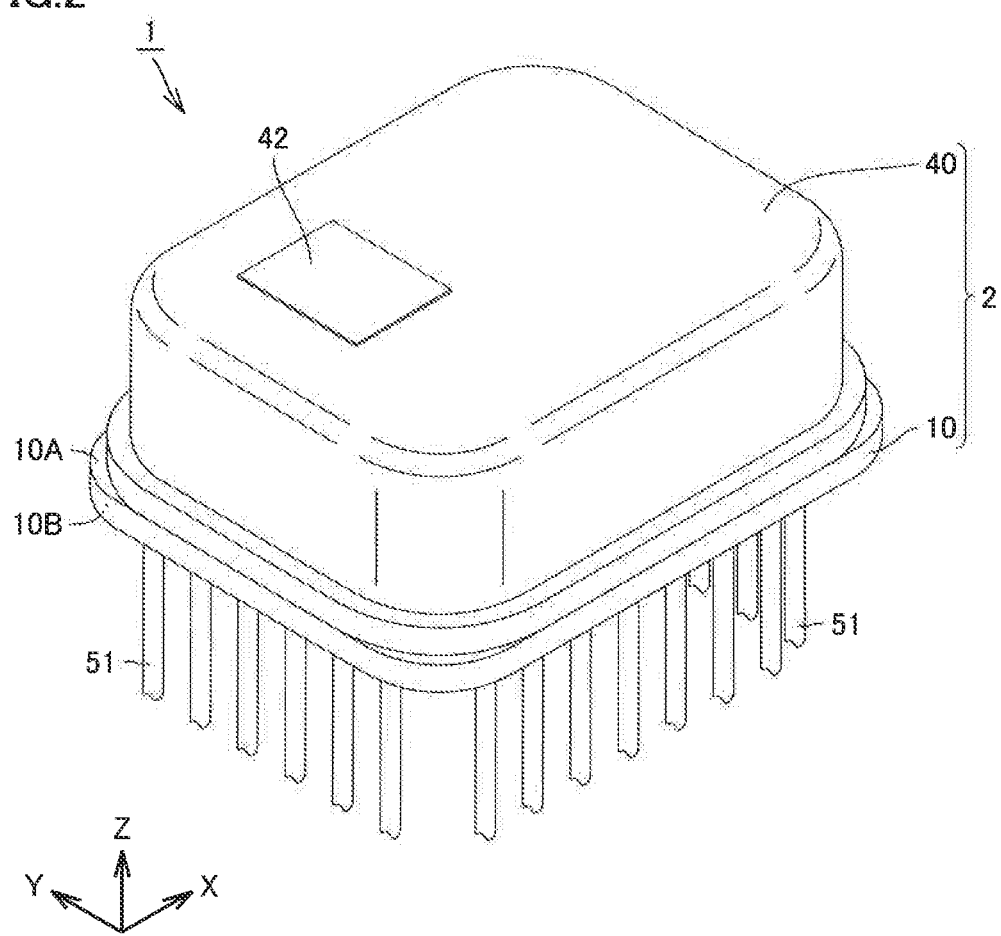
FIG. 2 is a schematic perspective view showing the structure of the optical module in Embodiment 1.
Figure 3:
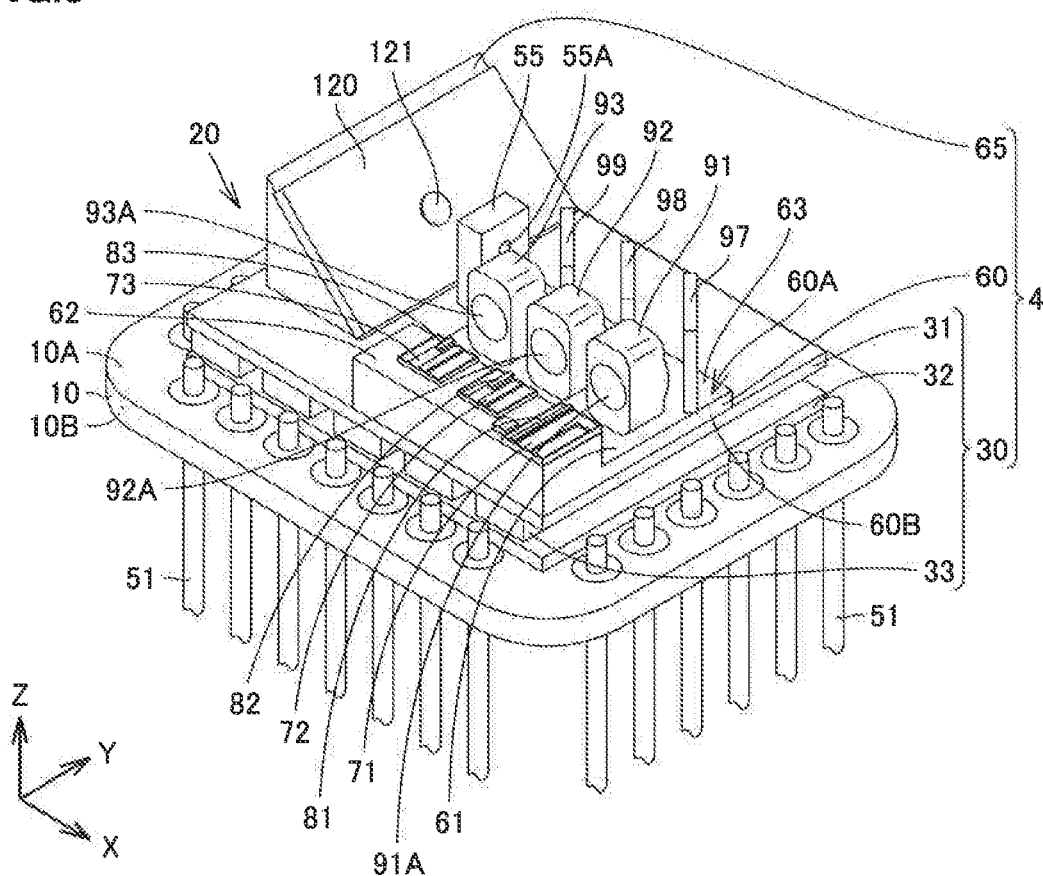
FIG. 3 is a schematic perspective view showing the structure of the optical module of Embodiment 1 with a cap removed therefrom.
Figure 4:
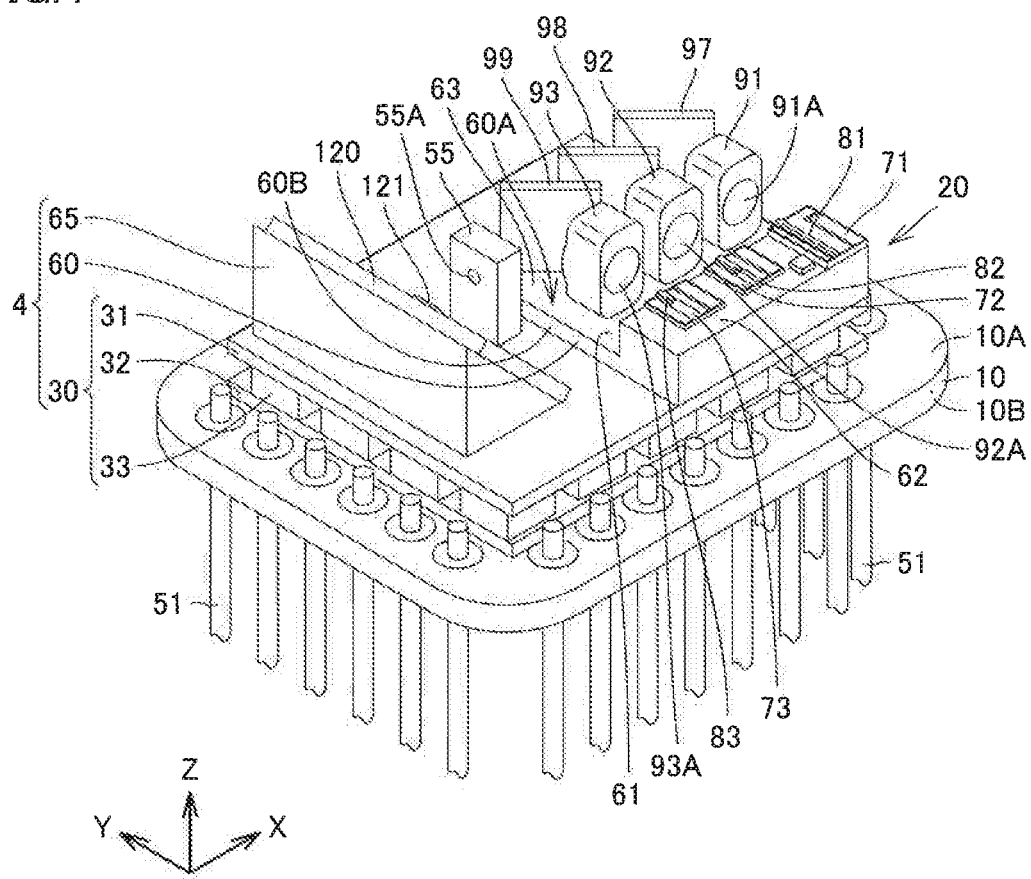
FIG. 4 is a schematic perspective view showing the structure of the optical module of Embodiment 1 with the cap removed therefrom.
Figure 5:
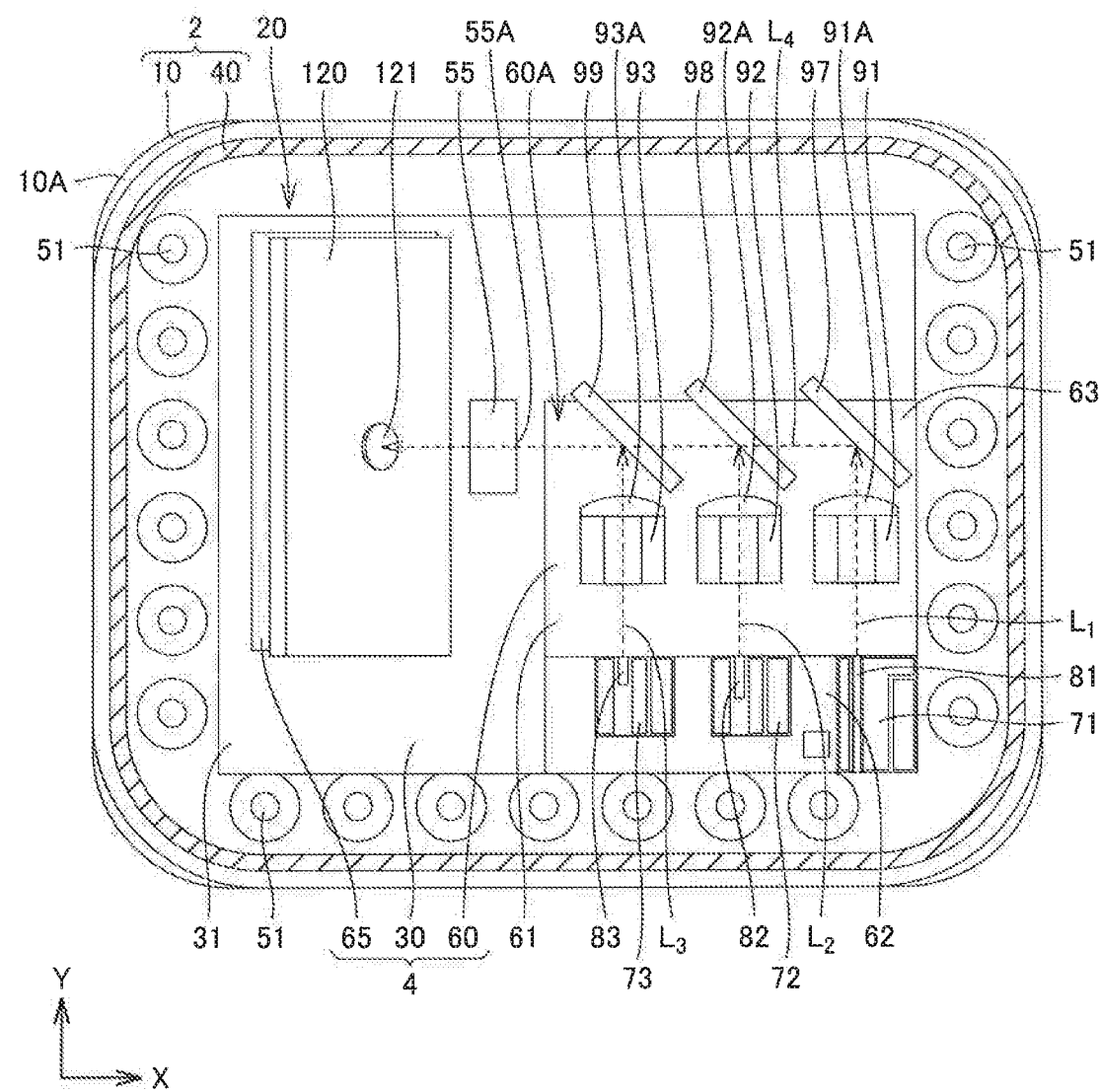
FIG. 5 is a schematic view showing the structure of the optical module in Embodiment 1.
Figure 6:
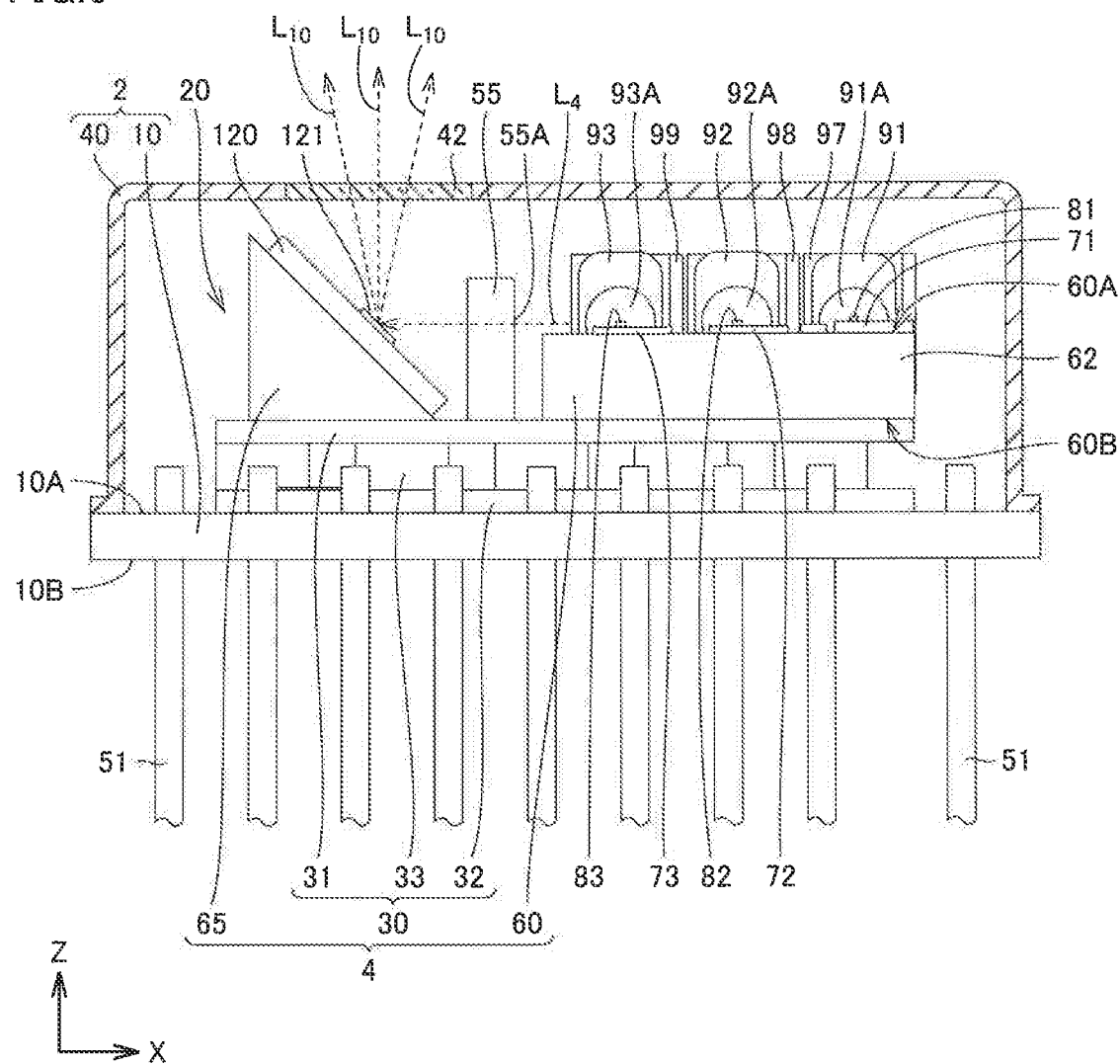
FIG. 6 is a schematic view showing the structure of the optical module in Embodiment 1.

Embodiment 1 will be described first with reference to FIGS. 1 to 6. FIG. 1 is a schematic perspective view showing the structure of an optical module in Embodiment 1. FIG. 2 is a schematic perspective view showing the structure of the optical module observed from a viewpoint different from that of FIG. 1. FIG. 3 is a perspective view corresponding to FIG. 1, with a cap 40 removed therefrom. FIG. 4 is a perspective view corresponding to FIG. 2, with the cap 40 removed therefrom. FIG. 5 is a schematic view in an X-Y plane, with the cap 40 shown in cross section and the other components in plan view. FIG. 6 is a schematic view in an X-Z plane, with the cap 40 shown in cross section and the other components in plan view.

Referring to FIGS. 1 to 4, the optical module 1 in the present embodiment includes a light-forming unit 20 configured to form light, and a protective member 2 which surrounds and seals the light-forming unit 20. The protective member 2 includes a base 10 as the base body, and a cap 40 as the lid welded to the base 10. In other words, the light-forming unit 20 is hermetically sealed by the protective member 2. The base 10 has a flat plate shape. The light-forming unit 20 is disposed on one main surface 10A of the base 10. The cap 40 is disposed on and in contact with the one main surface 10A of the base 10 to cover the light-forming unit 20. The base 10 has a plurality of lead pins 51 mounted thereon, the pins penetrating from another main surface 10B of the base 10 to the one main surface 10A and protruding from both sides of the one main surface 10A and the other main surface 10B. The base 10 and the cap 40 surround a space in which gas with the moisture reduced (or removed), such as dry air, is filled. The cap 40 has a window 42 formed therein. A plane-parallel plate type glass member, for example, is fitted in the window 42. In the present embodiment, the protective member 2 is an airtight member that keeps the interior airtight.

Referring to FIGS. 3 to 6, the light-forming unit 20 includes a base member 4, laser diodes 81, 82, and 83, filters 97, 98, and 99, an aperture member 55 as the beam shaping portion, and a MEMS 120.

The base member 4 includes an electronic temperature control module 30, a base plate 60, and an MEMS base 65. The electronic temperature control module 30 includes a heat absorbing plate 31 and a heat dissipation plate 32 each having a flat plate shape, and semiconductor pillars 33 arranged side by side between the heat absorbing plate 31 and the heat dissipation plate 32 with electrodes (not shown) interposed therebetween. The heat absorbing plate 31 and the heat dissipation plate 32 are made of alumina, for example. The electronic temperature control module 30 is disposed on the one main surface 10A of the base 10, with the heat dissipation plate 32 in contact with the one main surface 10A of the base 10.

The base plate 60 and the MEMS base 65 are disposed on and in contact with the heat absorbing plate 31. The base plate 60 has a plate shape. The base plate 60 has one main surface 60A of a rectangular (square) shape in plan view. The one main surface 60A of the base plate 60 includes a lens mounting region 61, a chip mounting region 62, and a filter mounting region 63. The chip mounting region 62 is formed in a region including one side of the one main surface 60A, along the one side. The lens mounting region 61 is arranged adjacent to and along the chip mounting region 62. The filter mounting region 63 is arranged in a region including another side opposing the above-described one side of the one main surface 60A, along the other side. The chip mounting region 62, the lens mounting region 61, and the filter mounting region 63 are parallel to each other.

The base plate 60 in the lens mounting region 61 and the base plate 60 in the filter mounting region 63 are equal in thickness. The lens mounting region 61 and the filter mounting region 63 are in the same plane. The base plate 60 is greater in thickness in the chip mounting region 62 than in the lens mounting region 61 and the filter mounting region 63. As a result, the chip mounting region 62 has a height (with respect to the lens mounting region 61, or, in the direction perpendicular to the lens mounting region 61) greater than those of the lens mounting region 61 and the filter mounting region 63.

On the chip mounting region 62, a first submount 71, a second submount 72, and a third submount 73 each having a flat plate shape are disposed side by side along the above-described one side of the one main surface 60A. The second submount 72 is arranged sandwiched between the first submount 71 and the third submount 73. The first submount 71 has a red laser diode 81 as a first laser diode disposed thereon. The second submount 72 has a green laser diode 82 as a second laser diode disposed thereon. The third submount 73 has a blue laser diode 83 as a third laser diode disposed thereon. The red laser diode 81, the green laser diode 82, and the blue laser diode 83 have optical axes whose heights (distances between the optical axes and a reference plane which is the lens mounting region 61 on the one main surface 60A; distances from the reference plane in the Z axis direction) are adjusted to match each other by the first submount 71, the second submount 72, and the third submount 73.

On the lens mounting region 61, a first lens 91, a second lens 92, and a third lens 93 are disposed. The first lens 91, the second lens 92, and the third lens 93 have lens portions 91A, 92A, and 93A, respectively, each having a surface of lens form. The first lens 91, the second lens 92, and the third lens 93 each have its lens portion 91A, 92A, 93A and the remaining region formed integrally. The lens portions 91A, 92A, and 93A of the first lens 91, the second lens 92, and the third lens 93 have their central axes, i.e. the optical axes of the lens portions 91A, 92A, and 93A, matching the optical axes of the red laser diode 81, the green laser diode 82, and the blue laser diode 83, respectively. The first lens 91, the second lens 92, and the third lens 93 convert the spot sizes of the light emitted from the red laser diode 81, the green laser diode 82, and the blue laser diode 83, respectively (or, convert the beam shape on a certain projection plane into a desired shape). The first lens 91, the second lens 92, and the third lens 93 cause the light emitted from the red laser diode 81, the green laser diode 82, and the blue laser diode 83 to have their spot sizes matching each other. With the first lens 91, the second lens 92, and the third lens 93, each of the light emitted from the red laser diode 81, the green laser diode 82, and the blue laser diode 83 is converted into collimated light.

On the filter mounting region 63, a first filter 97, a second filter 98, and a third filter 99 are disposed. The first filter 97 is arranged on a straight line connecting the red laser diode 81 and the first lens 91. The second filter 98 is arranged on a straight line connecting the green laser diode 82 and the second lens 92. The third filter 99 is arranged on a straight line connecting the blue laser diode 83 and the third lens 93. The first filter 97, the second filter 98, and the third filter 99 have flat plate shapes with their main surfaces parallel to each other. The first filter 97, the second filter 98, and the third filter 99 are wavelength selective filters, for example. The first filter 97, the second filter 98, and the third filter 99 may be dielectric multi-layer film filters.

More specifically, the first filter 97 reflects red light. The second filter 98 transmits red light and reflects green light. The third filter 99 transmits red and green light and reflects blue light. In this manner, the first filter 97, the second filter 98, and the third filter 99 selectively transmit or reflect light of specific wavelengths. As a result, the first filter 97, the second filter 98, and the third filter 99 multiplex the light emitted from the red laser diode 81, the green laser diode 82, and the blue laser diode 83.

The aperture member 55 is disposed on the heat absorbing plate 31. The aperture member 55 is arranged on a side of the third filter 99 opposite the second filter 98. The aperture member 55 has a flat plate shape. The aperture member 55 has a through hole 55A that penetrates through the aperture member 55 in its thickness direction. In the present embodiment, the through hole 55A has a circular shape in cross section perpendicular to the extending direction of the hole. The aperture member 55 is positioned such that the through hole 55A is located in a region corresponding to the optical path of the light multiplexed in the first filter 97, the second filter 98, and the third filter 99. The through hole 55A extends along the optical path of the light multiplexed in the first filter 97, the second filter 98, and the third filter 99. The light emitted from the laser diodes 81, 82, and 83 has an elliptic shape in cross section perpendicular to the traveling direction of the light. The diameter of the through hole 55A is smaller than the long diameter of the light multiplexed in the filters 97, 98, and 99 in the cross section perpendicular to the traveling direction of the light, and the aperture member 55 is arranged such that the central axis of the through hole 55A matches the optical axis of the multiplexed light. As a result, the light multiplexed in the filters 97, 98, and 99 has its shape, in cross section perpendicular to the traveling direction of the light, converted into a shape that is smaller than the inner diameter of the through hole 55A of the aperture member 55.

The MEMS base 65 has a triangular prism (right triangular prism) shape. The MEMS base 65 is disposed on the heat absorbing plate 31, with one lateral side of the triangular prism in contact with the heat absorbing plate 31. The MEMS base 65 has another lateral side on which the MEMS 120 including a scanning mirror 121 is disposed. The MEMS base 65 and the MEMS 120 are arranged on a side of the aperture member 55 opposite the third filter 99. In the present embodiment, the scanning mirror 121 has a disk shape. The MEMS 120 is arranged such that the scanning mirror 121 is positioned in a region corresponding to the optical path of the light shaped in the aperture member 55. The scanning mirror 121 can be made to swing at desired angles and directions. This enables the MEMS 120 including the scanning mirror 121 to scan the light shaped in the aperture member 55.

Referring to FIG. 5, the red laser diode 81, the lens portion 91A of the first lens 91, and the first filter 97 are arranged aligned (in the Y axis direction) along the light emission direction of the red laser diode 81. The green laser diode 82, the lens portion 92A of the second lens 92, and the second filter 98 are arranged aligned (in the Y axis direction) along the light emission direction of the green laser diode 82. The blue laser diode 83, the lens portion 93A of the third lens 93, and the third filter 99 are arranged aligned (in the Y axis direction) along the light emission direction of the blue laser diode 83.

The red laser diode 81, the green laser diode 82, and the blue laser diode 83 have their emission directions parallel to each other. The first filter 97, the second filter 98, and the third filter 99 have their main surfaces inclined 45° with respect to the emission directions (Y axis direction) of the red laser diode 81, the green laser diode 82, and the blue laser diode 83, respectively.

The electronic temperature control module 30 is disposed between the base 10 on one side and the base plate 60 and the MEMS base 65 on the other side. The heat absorbing plate 31 is in contact with the base plate 60 and the MEMS base 65. The heat dissipation plate 32 is in contact with the one main surface 10A of the base 10. In the present embodiment, the electronic temperature control module 30 is a Peltier module (Peltier element) which is an electronic cooling module. In the present embodiment, as a current is passed through the electronic temperature control module 30, the heat in the base plate 60 and the MEMS base 65 in contact with the heat absorbing plate 31 transfers to the base 10, whereby the base plate 60 and the MEMS base 65 are cooled. As a result, the temperatures of the laser diodes 81, 82, and 83 and the MEMS 120 are controlled to fall within an appropriate temperature range. This allows the optical module 1 to be used even under the environment where the temperature becomes high, as in the case of being mounted on an automobile, for example. As the temperatures of the red laser diode 81, the green laser diode 82, and the blue laser diode 83 are maintained in a proper range, light of a desired color can be formed with precision. Further, with the MEMS 120 controlled to an appropriate temperature, the operational stability against the temperature changes is improved.

An operation of the optical module 1 according to the present embodiment will now be described. Referring to FIG. 5, the red light emitted from the red laser diode 81 travels along an optical path $L_1$. This red light enters the lens portion 91A of the first lens 91, where the spot size of the light is converted. Specifically, for example, the red light emitted from the red laser diode 81 is converted into collimated light. The red light with its spot size converted in the first lens 91 travels along the optical path $L_1$ and falls on the first filter 97.

The first filter 97 reflects red light, so the light emitted from the red laser diode 81 travels further along an optical path $L_4$ to fall on the second filter 98. The second filter 98 transmits red light, so the light emitted from the red laser diode 81 travels further along the optical path $L_4$ to fall on the third filter 99. The third filter 99 transmits red light, so the light emitted from the red laser diode 81 travels further along the optical path $L_4$ to reach the aperture member 55. The light that has reached the aperture member 55 is shaped by the aperture member 55, and the resultant light travels further along the optical path $L_4$ to reach the scanning mirror 121.

The green light emitted from the green laser diode 82 travels along an optical path $L_2$. This green light enters the lens portion 92A of the second lens 92, where the spot size of the light is converted. Specifically, for example, the green light emitted from the green laser diode 82 is converted into collimated light. The green light with its spot size converted in the second lens 92 travels along the optical path $L_2$ to fall on the second filter 98.

The second filter 98 reflects green light, so the light emitted from the green laser diode 82 travels further along the optical path $L_4$ to fall on the third filter 99. The third filter 99 transmits green light, so the light emitted from the green laser diode 82 travels further along the optical path $L_4$ to reach the aperture member 55. The green light that has reached the aperture member 55 is shaped by the aperture member 55, and the resultant light travels further along the optical path $L_4$ to reach the scanning mirror 121.

The blue light emitted from the blue laser diode 83 travels along an optical path $L_3$. This blue light enters the lens portion 93A of the third lens 93, where the spot size of the light is converted. Specifically, for example, the blue light emitted from the blue laser diode 83 is converted into collimated light. The blue light with its spot size converted in the third lens 93 travels along the optical path $L_3$ to fall on the third filter 99.

The third filter 99 reflects blue light, so the light emitted from the blue laser diode 83 travels further along the optical path $L_4$ to reach the aperture member 55. The blue light that has reached the aperture member 55 is shaped by the aperture member 55, and the resultant light travels further along the optical path $L_4$ to reach the scanning mirror 121.

Light (multiplexed light) formed with the red, green, and blue light multiplexed in the above-described manner travels along the optical path $L_4$ to reach the scanning mirror 121. Then, referring to FIG. 6, the scanning mirror 121 is driven to scan the multiplexed light, so that characters and/or figures are drawn by the multiplexed light emitted along optical paths $L_{10}$ to the outside of the cap 40 through the window 42.

As described above, the optical module 1 includes the protective member 2, which includes the base 10 and the cap 40 welded to the base 10, and seals the light-forming unit 20. In other words, the light-forming unit 20 is hermetically sealed by the protective member 2. With this, the laser diodes 81, 82, 83, the MEMS 120, and others included in the light-forming unit 20 are effectively protected from the external environment, thereby ensuring high reliability. The MEMS 120 is disposed on the base member 4 including the electronic temperature control module 30. This enables the temperature of the MEMS 120 to be controlled appropriately by the electronic temperature control module 30, resulting in improved operational stability against the temperature changes. The optical module 1 therefore is an optical module excellent in reliability as well as in operational stability against temperature changes. The airtightness of the hermetic seal is preferably not more than $1\times10^{-10}$ (Pa·m³/s) in He (helium) leak rate, and further preferably not more than $1\times10^{-13}$ (Pa·m³/s). This facilitates suppressing dew condensation on the MEMS 120, the laser diodes 81, 82, 83, and others. Further, disposing the MEMS 120, the laser diodes 81, 82, 83, and others on the electronic temperature control module 30 having low thermal conductivity can suppress dew condensation on the MEMS 120, the laser diodes 81, 82, 83 and others that would otherwise be caused by dew condensation occurring on the protective member 2 as its temperature falls to or below the dew point with the decreased ambient temperature.

The MEMS 120 is preferably a piezoelectric MEMS. This can reduce the size of the MEMS 120 and ensure a large deflection angle of the scanning mirror 121.

The laser diodes 81, 82, and 83 of the optical module 1 are controlled by ACC. This eliminates the need of a light-receiving element for receiving light from the laser diodes 81, 82, and 83, resulting in a reduced production cost of the optical module.

In the optical module 1, the aperture member 55 is adopted as the beam shaping portion. Although a lens, a prism, or the like may be adopted as the beam shaping portion, adopting the aperture member 55 as the beam shaping portion can reduce the production cost of the optical module. Further, with the laser diodes 81, 82, and 83 controlled by ACC, there is no need to make parts of the light from the laser diodes 81, 82, and 83 incident on a light-receiving element for the purposes of detecting the intensities of the light. The intensity of the light that reaches the aperture member 55 serving as the beam shaping portion thus becomes high, so even in the case where the light intensity is decreased in the aperture member 55, the light with sufficient intensity can be emitted to the outside of the optical module 1.

Further, in the optical module 1, the scanning mirror 121 has an outer diameter not smaller than the beam diameter (in cross section perpendicular to the light traveling direction) of the light shaped by the aperture member 55. This suppresses an undesirable event that the light that has reached the MEMS 120 but has not been scanned by the scanning mirror 121 is reflected at a position other than the scanning mirror 121 to cause stray light.

Figure 7:
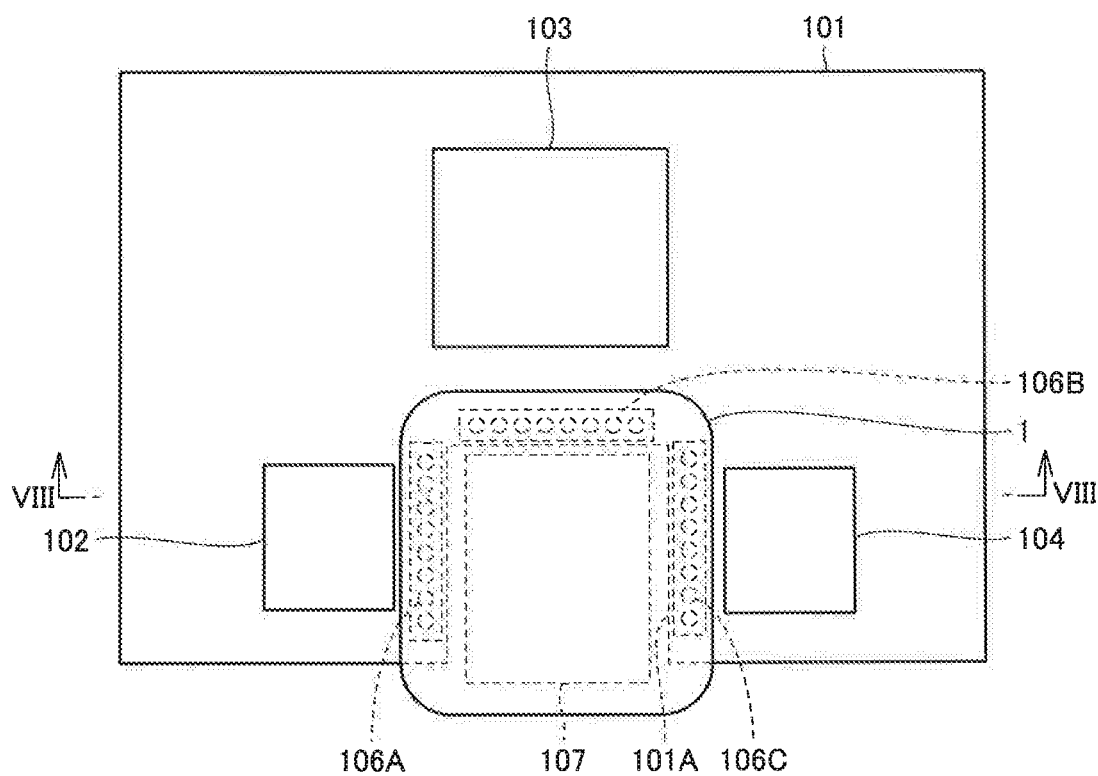
FIG. 7 is a schematic plan view showing the state where the optical module in Embodiment 1 is arranged on a board.
Figure 8:
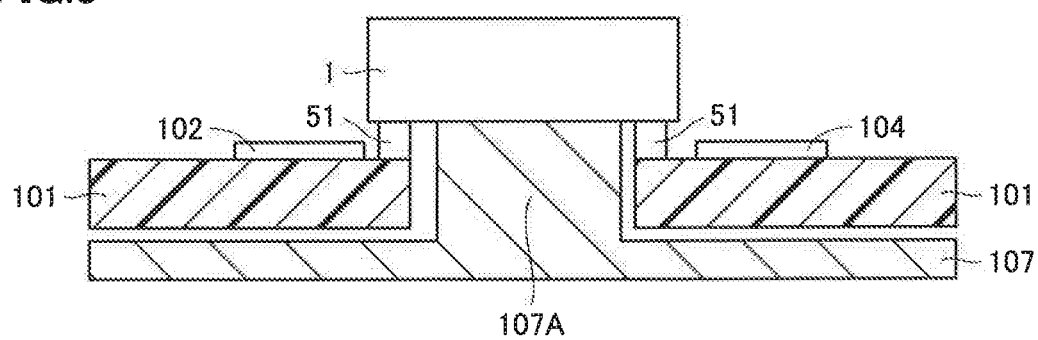
FIG. 8 is a schematic cross-sectional view showing the state where the optical module in Embodiment 1 is arranged on the board.

A description will now be given of an exemplary arrangement of the optical module 1 on a board with reference to FIGS. 7 and 8. FIG. 7 is a schematic plan view showing the state where an optical module is arranged on a board. FIG. 8 is a schematic cross-sectional view showing the state where the optical module is arranged on the board, which corresponds to the cross section taken along the line VIII-VIII in FIG. 7. Referring to FIGS. 7 and 8, the optical module 1 can be disposed on and operated on a printed circuit board 101 having a desired circuit formed thereon, for example. The printed circuit board 101 can be disposed on a heatsink 107. The heatsink 107 has a protruding portion 107A. The printed circuit board 101 has a notch portion 101A formed in a shape corresponding to the protruding portion 107A. The printed circuit board 101 is disposed on the heatsink 107, with the protruding portion 107A penetrating through the printed circuit board 101 in the thickness direction in the notch portion 101A.

On the printed circuit board 101, an LD driver IC 102 which is a driver integrated circuit (IC) for driving the laser diodes (LDs), an MEMS driver IC 104 as a driver IC for driving the MEMS, and a main IC 103 are disposed. The main IC 103 may be, for example, an application specific integrated circuit (ASIC) or a field programmable gate array (FPGA). The LD driver IC 102, the main IC 103, and the MEMS driver IC 104 are arranged along an outer periphery of the printed circuit board 101 surrounding the notch portion 101A. The LD driver IC 102 and the MEMS driver IC 104 are arranged to sandwich the notch portion 101A therebetween.

On the printed circuit board 101, a first module interface 106A is arranged between the region where the LD driver IC 102 is disposed and the notch portion 101A. The first module interface 106A is capable of receiving lead pins 51 associated with driving of the laser diodes 81, 82, and 83 of the optical module 1. On the printed circuit board 101, a second module interface 106C is arranged between the region where the MEMS driver IC 104 is disposed and the notch portion 101A. The second module interface 106C is capable of receiving lead pins 51 associated with driving of the MEMS 120 of the optical module 1. On the printed circuit board 101, a third module interface 106B is arranged between the region where the main IC 103 is disposed and the notch portion 101A. The third module interface 106B is capable of receiving lead pins 51 other than those described above. The optical module 1 is mounted on the printed circuit board 101, with the lead pins 51 of the optical module 1 being received in the module interfaces 106A, 106B, and 106C. The lead pins 51 are joined to the module interfaces 106A, 106B, and 106C by soldering, for example.

Figure 9:
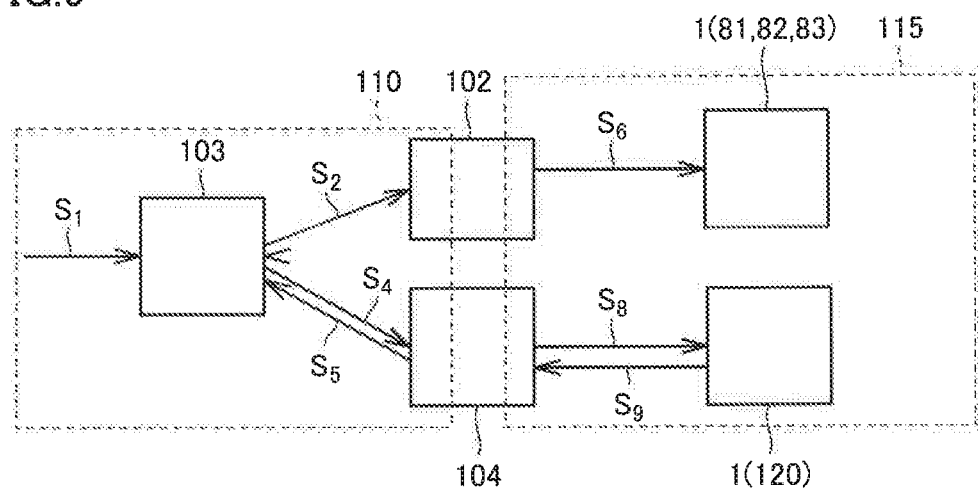
FIG. 9 is a block diagram illustrating flows of signals during operation of an optical module.

A description will now be given of an exemplary method of controlling the optical module 1 disposed on the printed circuit board 101 with reference to FIGS. 7 to 9. FIG. 9 is a block diagram illustrating flows of signals during operation of the optical module 1. Referring to FIG. 9, when image signals $S_1$ are input to the main IC 103, the main IC 103 outputs LD control signals $S_2$ such as video signals and ACC signals to the LD driver IC 102, and also outputs MEMS control signals $S_4$ to the MEMS driver IC 104. The LD driver IC 102, on the basis of the LD control signals $S_2$, outputs LD drive signals $S_6$ to drive the laser diodes 81, 82, and 83 of the optical module 1. The MEMS driver IC 104, on the basis of the MEMS control signals $S_4$, outputs MEMS drive signals $S_8$ to drive the MEMS 120 of the optical module 1. At this time, an optical deflection angle of the scanning mirror 121 in the MEMS 120 is confirmed by a monitoring element (not shown), and feedback signals $S_9$ are output to the MEMS driver IC 104. The MEMS driver IC 104, on the basis of the feedback signals $S_9$, outputs phase locked loop (PLL) signals $S_5$ to the main IC 103. Then, the MEMS control signals $S_4$ corrected on the basis of the information included in the PLL signals $S_5$ are output from the main IC 103 to the MEMS driver IC 104. The signals $S_1$, $S_2$, $S_4$, and $S_5$ falling in the area delimited by the broken line 110 are digital signals. The signals $S_6$, $S_8$, and $S_9$ falling in the area delimited by the broken line 115 are analog signals.

Here, in the optical module 1 in the present embodiment, the light-forming unit 20 including the laser diodes 81, 82, and 83, and the MEMS 120 is arranged inside the protective member 2. This configuration facilitates mounting of the module directly on the printed circuit board 101 as described above, contributing to cost reduction by saving of the printed circuit board. The configuration also facilitates positioning of the LD driver IC 102 and the first module interface 106A for receiving the lead pins 51 associated with the driving of the laser diodes 81, 82, and 83 in proximity to each other as described above, enabling reduction of the line length between the LD driver IC 102 and the lead pins 51 associated with the driving of the laser diodes 81, 82, and 83. As the LD drive signals $S_6$ output from the LD driver IC 102 to the optical module 1 are analog signals, the impedance between the LD driver IC 102 and the optical module 1 will particularly strongly affect the responsivity. When the line length between the LD driver IC 102 and the lead pins 51 associated with the driving of the laser diodes 81, 82, and 83 is shortened as in the present embodiment, the impedance is reduced, leading to improved responsivity of the optical output. As a result, the optical module 1 of the present embodiment is an optical module that is readily adaptable even to an increase in number of pixels or the like.

Embodiment 2

Figure 10:
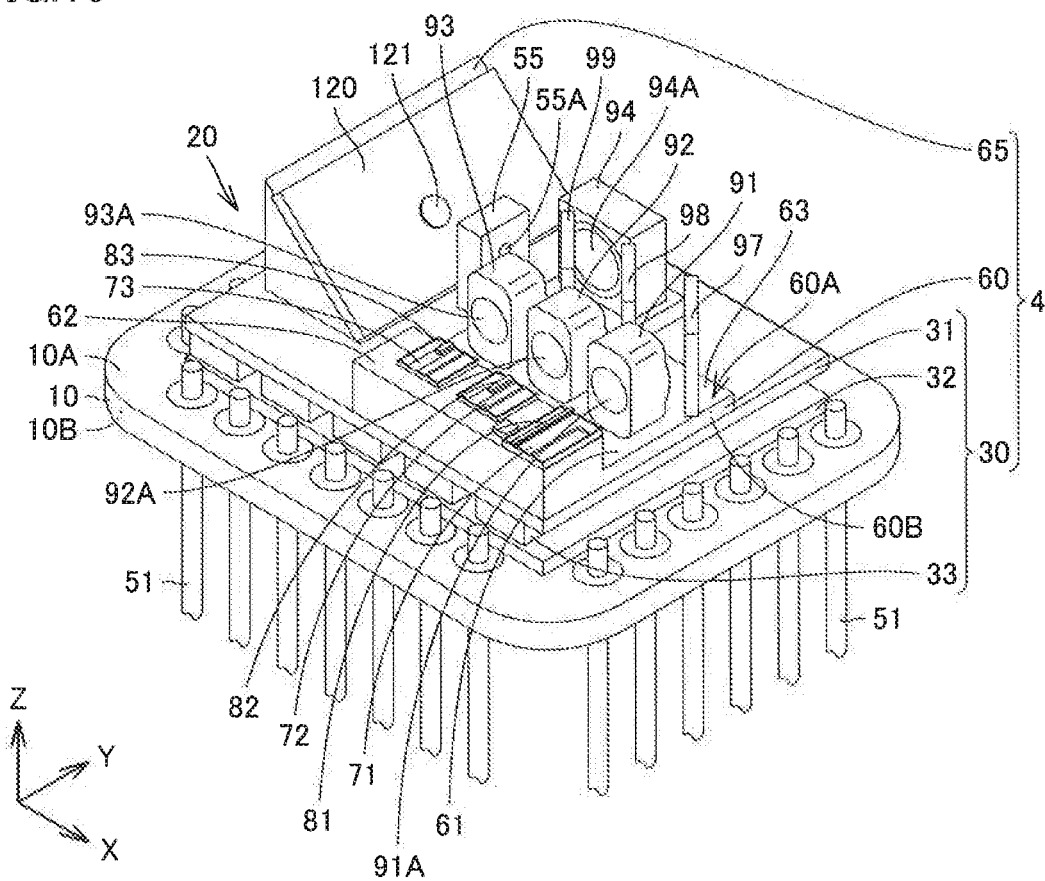
FIG. 10 is a schematic perspective view showing the structure of an optical module of Embodiment 2 with a cap removed therefrom.
Figure 11:
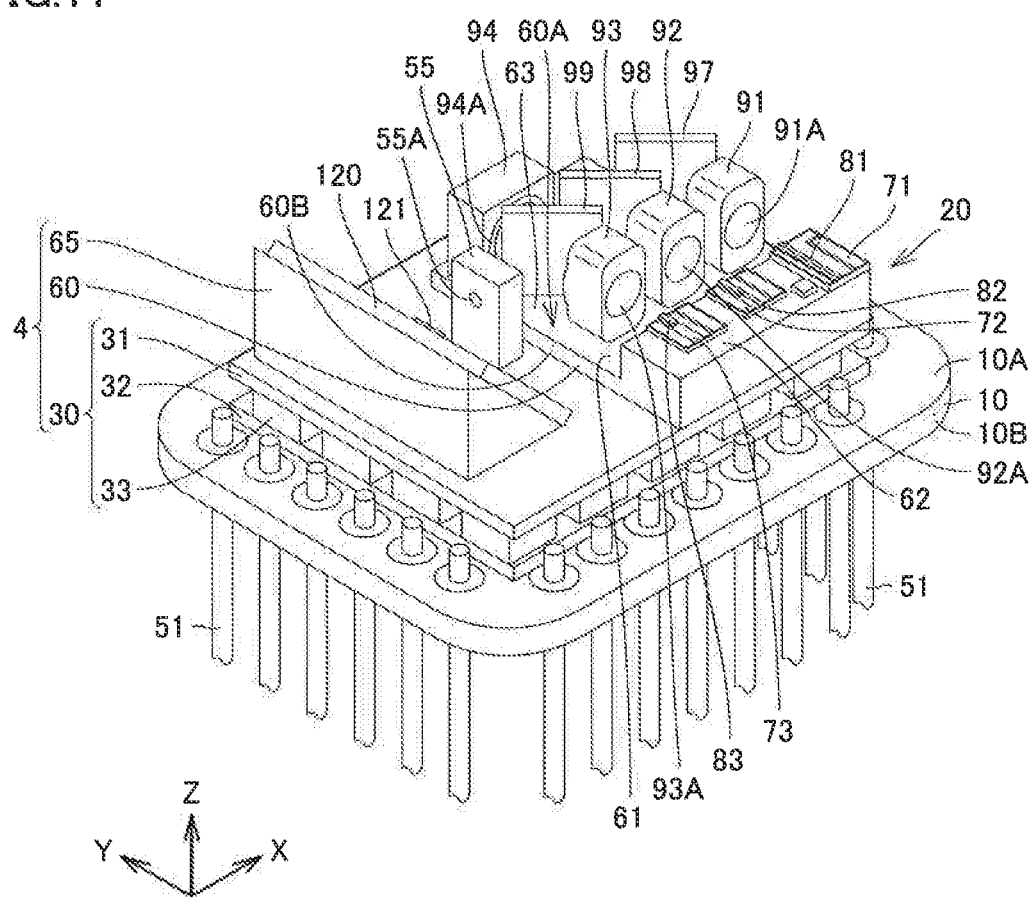
FIG. 11 is a schematic perspective view showing the structure of the optical module of Embodiment 2 with the cap removed therefrom.
Figure 12:
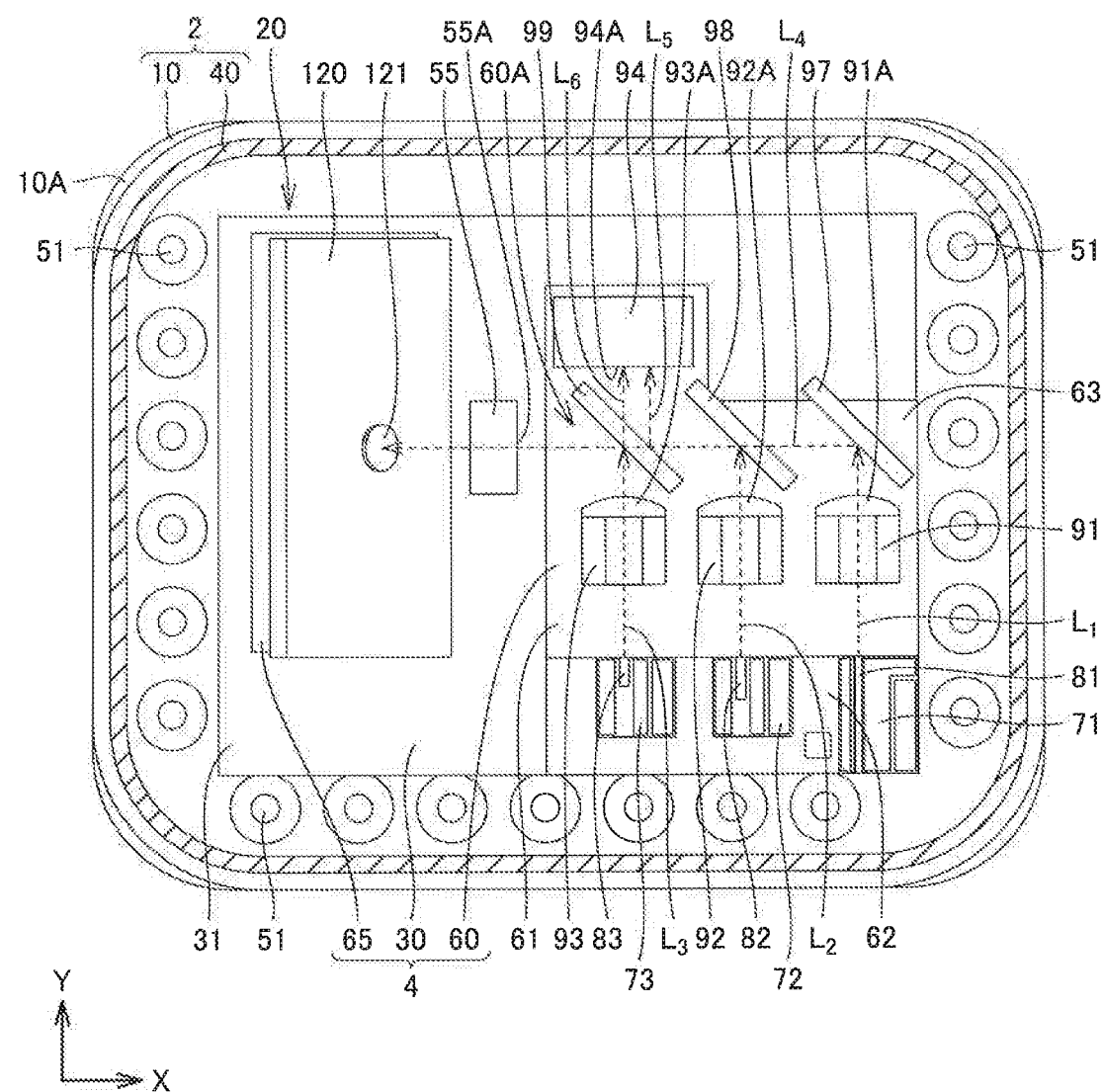
FIG. 12 is a schematic view showing the structure of the optical module in Embodiment 2.

Embodiment 2 as another embodiment will now be described with reference to FIGS. 10 to 12. FIG. 10, corresponding to FIG. 3 in Embodiment 1, is a schematic perspective view showing the structure of an optical module of Embodiment 2 with a cap removed therefrom. FIG. 11, corresponding to FIG. 4 in Embodiment 1, is a schematic perspective view showing the structure of the optical module of Embodiment 2 with the cap removed therefrom. FIG. 12, corresponding to FIG. 5 in Embodiment 1, is a schematic view showing the structure of the optical module in Embodiment 2.

Referring to FIGS. 10 to 12 and 3 to 5, the optical module in Embodiment 2 basically has a similar structure as and produces similar effects as that in Embodiment 1. The optical module 1 of Embodiment 2 differs from that of Embodiment 1 in terms of the way of controlling the laser diodes.

Specifically, the light-forming unit 20 of the optical module 1 in Embodiment 2 includes a photodiode 94 as a light-receiving element. The photodiode 94 is disposed on the one main surface 60A of the base plate 60. The base plate 60 has an additional region for holding the photodiode 94 as compared to the case of Embodiment 1. The photodiode 94 includes a light-receiving portion 94A. The blue laser diode 83, the lens portion 93A of the third lens 93, the third filter 99, and the light-receiving portion 94A of the photodiode 94 are arranged aligned (in the Y axis direction) along the light emission direction of the blue laser diode 83. In the present embodiment, although the third filter 99 transmits most parts of red and green light, it reflects a part of the rest. Although the third filter 99 reflects most part of blue light, it transmits a part of the rest.

A description will now be given of how the operation of the optical module 1 in Embodiment 2 differs from that in Embodiment 1. Parts of the red and green light that has reached the third filter 99 are reflected at the third filter 99, and travel along optical paths $L_5$ and $L_6$ to fall on the light-receiving portion 94A of the photodiode 94. Part of the blue light that has reached the third filter 99 is transmitted through the third filter 99, and travels along the optical path $L_6$ to fall on the light-receiving portion 94A of the photodiode 94. Then, on the basis of the information on the intensities of the red, green, and blue light received in the photodiode 94, the values of the current passed through the red laser diode 81, the green laser diode 82, and the blue laser diode 83 are adjusted. That is, in Embodiment 2, the red laser diode 81, the green laser diode 82, and the blue laser diode 83 are controlled by APC. The APC may be adopted in place of the ACC in the above-described manner when strict control of the laser diodes 81, 82, and 83 is required.

Embodiment 3

Figure 13:
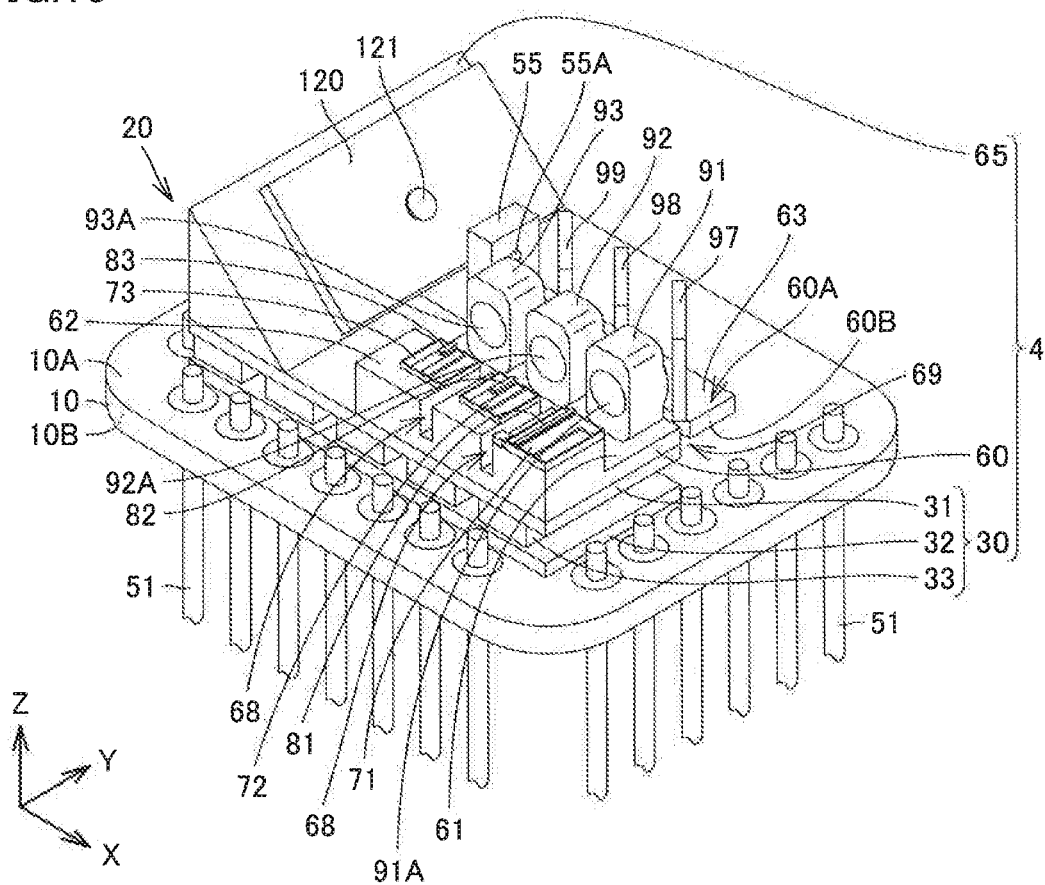
FIG. 13 is a schematic perspective view showing the structure of an optical module of Embodiment 3 with a cap removed therefrom.
Figure 14:
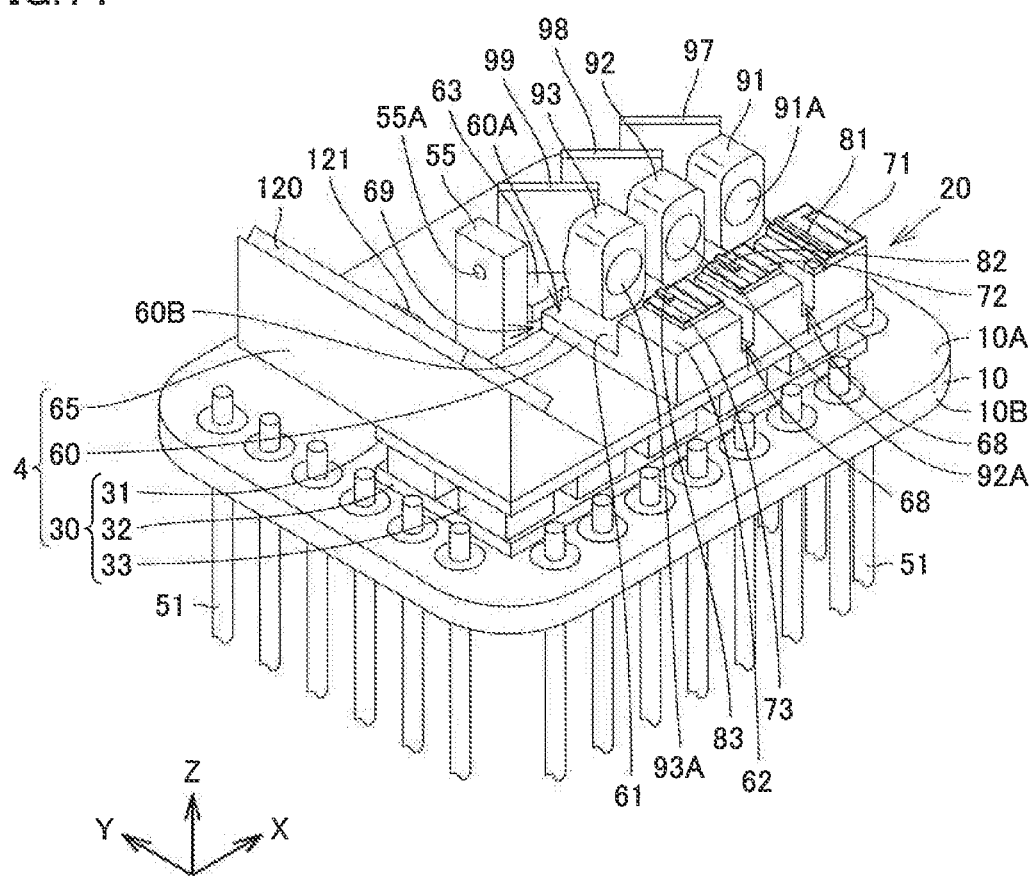
FIG. 14 is a schematic perspective view showing the structure of the optical module of Embodiment 3 with the cap removed therefrom.
Figure 15:
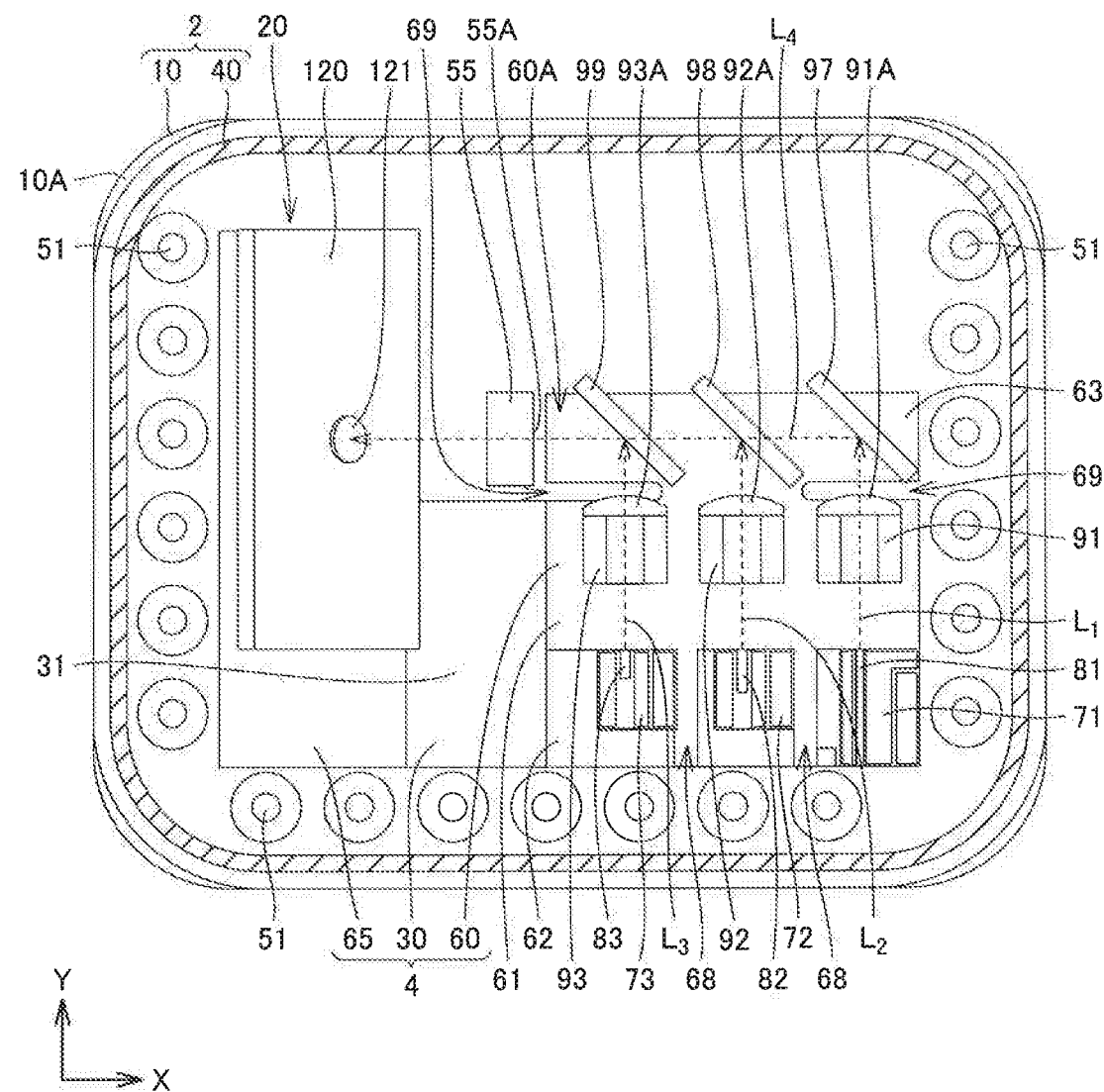
FIG. 15 is a schematic view showing the structure of the optical module in Embodiment 3.
Figure 16:
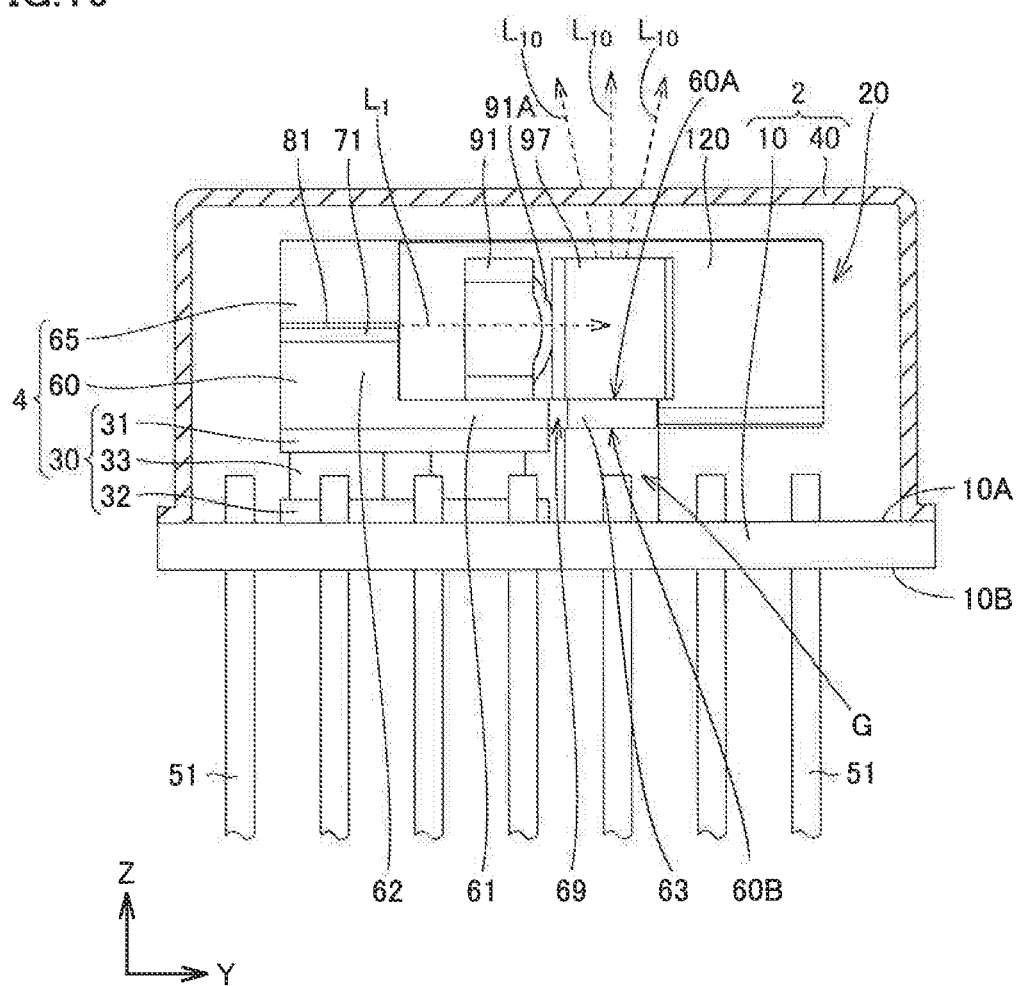
FIG. 16 is a schematic view showing the structure of the optical module in Embodiment 3.

Embodiment 3 as another embodiment will now be described with reference to FIGS. 13 to 16. FIG. 13, corresponding to FIG. 3 in Embodiment 1, is a schematic perspective view showing the structure of an optical module of Embodiment 3 with a cap removed therefrom. FIG. 14, corresponding to FIG. 4 in Embodiment 1, is a schematic perspective view showing the structure of the optical module of Embodiment 3 with the cap removed therefrom. FIG. 15, corresponding to FIG. 5 in Embodiment 1, is a schematic view showing the structure of the optical module in Embodiment 3. FIG. 16 is a schematic view showing the structure of the optical module in Embodiment 3, with the optical module 1 observed in a direction along the X axis direction. FIG. 16 is a schematic view in a Y-Z plane showing the cap 40 in cross section and the other components in plan view.

Referring to FIGS. 13 to 16, a portion of the base plate 60 corresponding to the filter mounting region 63 has its other main surface 60B opposing the one main surface 10A of the base 10, with a gap G open to the outside being sandwiched therebetween. The height of the gap i.e. the distance between the main surface 10A and the main surface 60B in the Z axis direction, corresponds to the height of the electronic temperature control module 30 in the Z axis direction. The regions of the base plate 60 corresponding to the chip mounting region 62 and the lens mounting region 61 are in contact with the electronic temperature control module 30.

Adopting such a structure allows the amount of warpage of the filter mounting region 63 to be reduced as compared to the amounts of warpage of the chip mounting region 62 and the lens mounting region 61 even when the environment where the optical module 1 is arranged experiences a considerable temperature change. This can suppress tilting of the filters 97, 98, and 99 mounted on the base plate 60 due to the warpage of the base plate 60. As a result, it is possible to suppress the misalignment in optical axis of the light beams from the red laser diode 81, the green laser diode 82, and the blue laser diode 83 multiplexed by the filters 97, 98, and 99.

Further, the base plate 60 has a pair of base plate notch portions 69 formed between the region corresponding to the lens mounting region 61 and the region corresponding to the filter mounting region 63. One of the base plate notch portions 69 is formed in the region between the first lens 91 and the first filter 97, and the other of the base plate notch portions 69 is formed in the region between the third lens 93 and the third filter 99.

Adopting such a structure can suppress an adverse effect of the warpage in the lens mounting region 61 on the filter mounting region 63.

Furthermore, the region of the base plate 60 corresponding to the chip mounting region 62 includes thin portions 68 between the blue laser diode 83 mounting region and the green laser diode 82 mounting region, and between the green laser diode 82 mounting region and the red laser diode 81 mounting region. The thin portions 68 are reduced in thickness than the remaining region of the chip mounting region 62. The thin portions 68 are formed over the entire length in the Y axis direction (light emission directions of the laser diodes 81, 82, and 83) of the chip mounting region 62.

Adopting such a structure can reduce the difference between the amount of warpage in the lens mounting region 61 and that in the chip mounting region 62. As a result, it is possible to suppress the misalignment in optical axis between the laser diodes 81, 82, and 83, and the lenses 91, 92, and 93.

In this manner, adopting the structure of the present embodiment enables the optical module 1 to operate in a stable manner even in the event of a considerable change of the external temperature.

While the description was made about the case of multiplexing light from three laser diodes in the above embodiments, light from two laser diodes or four or more laser diodes may be multiplexed. Further, while the description was made about the case of adopting wavelength selective filters as the first filter 97, the second filter 98, and the third filter 99 in the above embodiments, the filters may be polarization combining filters, for example.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

DESCRIPTION OF REFERENCE NUMERALS

1: optical module; 2: protective member; 4: base member; 10: base; 10A, 10B: main surface; 20: light-forming unit; 30: electronic temperature control module; 31: heat absorbing plate; 32: heat dissipation plate; 33: semiconductor pillar; 40: cap; 42: window; 51: lead pin; 55: aperture member; 55A: through hole; 60: base plate; 60A, 60B: main surface; 61: lens mounting region; 62: chip mounting region; 63: filter mounting region; 65: MEMS base; 68: thin portion; 69: base plate notch portion; 71: first submount; 72: second submount; 73: third submount; 81: red laser diode; 82: green laser diode; 83: blue laser diode; 91: first lens; 91A, 92A, 93A: lens portion; 92: second lens; 93: third lens; 94: photodiode; 94A: light-receiving portion; 97: first filter; 98: second filter; 99: third filter; 101: printed circuit board; 101A: notch portion; 102: LD driver IC; 103: main IC; 104: MEMS driver IC; 106A: first module interface; 106B: second module interface; 106C: third module interface; 107: heatsink; 107A: protruding portion; 120: MEMS; and 121: scanning mirror.

The invention claimed is:

1. An optical module comprising:
a light-forming unit configured to form light, the light-forming unit including:
a base member including:
an electronic temperature control module,
a base plate disposed on the electronic temperature control module,
a plurality of submounts disposed on the base plate, and
a microelectromechanical system (MEMS) base disposed on the electronic temperature control module,
a plurality of laser diodes arranged on the submounts of the base member, the plurality of laser diodes being configured to emit light,
a filter arranged on the base plate of the base member, the filter being located to receive the light emitted from the plurality of laser diodes and configured to multiplex the emitted light from the plurality of laser diodes,
a beam shaping portion arranged on the electronic temperature control module of the base member and adjacent to the filter, the beam shaping portion being configured to receive the light multiplexed by the filter and to convert a beam shape of the light multiplexed by the filter, and
a MEMS arranged on the MEMS base of the base member and adjacent to the beam shaping portion to receive the light shaped in the beam shaping portion, the MEMS including a scanning mirror configured to scan the light shaped in the beam shaping portion, the electronic temperature control module regulating a temperature range of the MEMS; and
a protective member surrounding and sealing the light-forming unit, the protective member including:
a base body, and
a lid welded to the base body.

2. The optical module according to claim 1, wherein the MEMS is a piezoelectric MEMS.

3. The optical module according to claim 1, wherein the beam shaping portion is an aperture member.

4. The optical module according to claim 1, wherein the plurality of laser diodes are controlled by auto current control (ACC).

5. The optical module according to claim 1, wherein the plurality of laser diodes include a laser diode emitting red light, a laser diode emitting green light, and a laser diode emitting blue light.

* * * * *